United States Patent [19]
Galbraith et al.

[11] Patent Number: 5,440,245
[45] Date of Patent: * Aug. 8, 1995

[54] LOGIC MODULE WITH CONFIGURABLE COMBINATIONAL AND SEQUENTIAL BLOCKS

[75] Inventors: Douglas C. Galbraith, Fremont; Abbas El Gamal; Jonathan W. Greene, both of Palo Alto, all of Calif.

[73] Assignee: Actel Corporation, Sunnyvale, Calif.

[*] Notice: The portion of the term of this patent subsequent to Oct. 8, 2008 has been disclaimed.

[21] Appl. No.: 28,789

[22] Filed: Mar. 9, 1993

Related U.S. Application Data

[63] Continuation of Ser. No. 773,353, Oct. 7, 1991, Pat. No. 5,198,705, which is a continuation of Ser. No. 522,232, May 11, 1990, Pat. No. 5,055,718.

[51] Int. Cl.[6] ............................................. H03K 19/177
[52] U.S. Cl. ........................................ 326/38; 326/113
[58] Field of Search ................................... 326/38, 113

[56] References Cited

U.S. PATENT DOCUMENTS

| | | |
|---|---|---|
| 3,106,698 | 10/1963 | Unger . |
| 3,287,702 | 11/1966 | Borck, Jr. et al. . |
| 3,287,703 | 11/1966 | Slotnick . |
| 3,473,160 | 10/1969 | Wahlstrom . |
| 3,619,583 | 11/1971 | Arnold . |
| 4,140,924 | 2/1979 | Ogney et al. . |
| 4,157,480 | 6/1979 | Edwards . |
| 4,240,094 | 12/1980 | Mader . |
| 4,293,783 | 10/1981 | Patil . |
| 4,354,228 | 10/1982 | Moore et al. . |
| 4,354,266 | 10/1982 | Cooperman ........................ 370/112 |
| 4,414,547 | 11/1983 | Knapp et al. . |
| 4,424,456 | 1/1984 | Shiraki et al. . |
| 4,453,096 | 6/1984 | Le Can et al. ........................ 307/448 |

(List continued on next page.)

FOREIGN PATENT DOCUMENTS

| | | |
|---|---|---|
| 0081917 | 11/1982 | European Pat. Off. . |
| 0177261 | 4/1986 | European Pat. Off. . |

OTHER PUBLICATIONS

J. Sklansky; Conditional-Sum Addition Logic; IRE Transactions on electronic computers; 1959.

W. H. Kautz, K. Levitt, A. Waksman, Cellular Interconnection Arrays, IEEE Transactions on Computers, vol. C-17, No. 5, p. 443, May 1968.

W. H. Kautz, Cellular Logic-in-Memory Arrays, (List continued on next page.)

*Primary Examiner*—David R. Hudspeth
*Attorney, Agent, or Firm*—D'Alessandro & Ritchie

[57] ABSTRACT

A logic module includes a first and a second two-input multiplexer each having first and second data inputs. Both the first and second multiplexer include a select input, both of which are connected to the output of a two-input logic gate of a first type having first and second data inputs. The inputs to the first and second two-input multiplexers are sourced with data signals from a first group. One input of each of the logic gates is sourced from a data signal of a second group and the other input of each of the logic gates is sourced from a data signal of a third group. A third two-input multiplexer has its first and second data inputs connected the outputs of the first and second multiplexers, respectively. A select input of the third two-input multiplexer is connected to the output of a two input logic gate of a second type having first and second data inputs. The output of the third two-input multiplexer is connected to a first data input of a fourth two-input multiplexer having a HOLD1 input coupled to its select input. Its output is and a CLEAR input are presented to an AND gate whose output is connected to the second data input of the fourth two-input multiplexer and to the first data input of a fifth two-input multiplexer. The select input of the fifth two-input multiplexer is connected to a HOLD2 input. Its output and the CLEAR input are presented to an AND gate whose output is connected to the second data input of the fifth two-input multiplexer and to an output node. The CLEAR, HOLD1 and HOLD2 inputs are defined by combinations of signals from a data signal of a third group which may contain a data signal of one of the other groups.

11 Claims, 5 Drawing Sheets

U.S. PATENT DOCUMENTS

| | | | |
|---|---|---|---|
| 4,491,839 | 1/1985 | Adam | 340/825.91 |
| 4,513,307 | 4/1985 | Brown . | |
| 4,541,067 | 9/1985 | Whitaker . | |
| 4,546,455 | 10/1985 | Iwahashi et al. . | |
| 4,551,634 | 11/1985 | Takahashi et al. | 307/243 |
| 4,558,236 | 12/1985 | Burrows | 307/465 |
| 4,577,124 | 3/1986 | Koike | 307/451 |
| 4,609,986 | 9/1986 | Hartmann et al. . | |
| 4,616,358 | 10/1986 | Rehm et al. . | |
| 4,617,479 | 10/1986 | Hartmann et al. . | |
| 4,620,117 | 10/1986 | Fang | 307/451 |
| 4,639,896 | 1/1987 | Brannigan et al. . | |
| 4,644,191 | 2/1987 | Fisher et al. . | |
| 4,670,748 | 6/1987 | Williams . | |
| 4,684,829 | 8/1987 | Uratani | 307/449 |
| 4,684,830 | 8/1987 | Tsui et al. . | |
| 4,703,206 | 10/1987 | Cavian . | |
| 4,703,436 | 10/1987 | Varshney . | |
| 4,706,216 | 11/1987 | Carter | 365/94 |
| 4,710,649 | 12/1987 | Lewis | 307/451 |
| 4,717,912 | 1/1988 | Harvey et al. . | |
| 4,754,456 | 6/1988 | Yato et al. . | |
| 4,758,746 | 7/1988 | Birkner et al. . | |
| 4,758,985 | 7/1988 | Carter | 365/94 |
| 4,764,893 | 8/1988 | Karabatsos . | |
| 4,786,904 | 11/1988 | Graham, III et al. . | |
| 4,787,064 | 11/1988 | Wagner . | |
| 4,789,951 | 12/1988 | Birkner et al. | 364/716 |
| 4,821,176 | 4/1989 | Ward et al. . | |
| 4,825,105 | 4/1989 | Holzle | 307/440 |
| 4,847,612 | 7/1989 | Kaplinsky . | |
| 4,852,021 | 7/1989 | Inoue et al. . | |
| 4,855,616 | 8/1989 | Wang et al. . | |
| 4,870,302 | 9/1989 | Freeman | 307/465 |
| 4,906,987 | 3/1990 | Venaleck et al. . | |
| 4,910,417 | 3/1990 | El Gamal et al. | 307/465 |
| 4,912,339 | 12/1988 | Bechade et al. | 307/243 |
| 4,924,287 | 5/1990 | Orbach . | |
| 4,933,577 | 6/1990 | Wong et al. | 307/465 |
| 4,963,770 | 10/1990 | Keida . | |
| 5,003,200 | 3/1991 | Sakamoto . | |
| 5,019,736 | 5/1991 | Furtek . | |
| 5,122,685 | 6/1992 | Chan et al. | 307/465.1 |

OTHER PUBLICATIONS

IEEE Transactions on Computers, vol. C-18, No. 8, p. 719, Aug. 1969.

D. Greer, An Associative Logic Matrix, IEEE Journal of Solid-State Circuits, vol. SC-11, No. 5, p. 679, Oct. 1976.

S. S. Patil and T. Welch, A Programmable Logic Approach for VLSI, IEEE Journal of Solid-State Circuits vol. C-28, No. 9, p. 594, Sep. 1979.

R. Wood, Y. Hsieh, C. Price and P. Wang, An Electrically Alterable PLA for Fast Turnaround-Time VLSI Development Hardware, IEEE Journal of Solid-State Circuits vol. SC-16, No. 5, p. 570, Oct. 1981.

G. Gentile, M. G. Sami M. Terzoli, Design of Switches for Self-Reconfiguring VLSI Array Structures; Microprocessing and Microprogramming, 14; p. 99, 1984.

A. Srivastava, S. Gupta and C. Shekhar, Computer-Aided Design of an Eight Bit Binary Counter N-MOS Chip for Large Scale Integration (LSI), Microelectronics and Reliability; Pergamon Press, vol. 24, No. 5, p. 827, 1984.

T. Mangir, Sources of Failures and Yield Improvement for VLSI and Restructurable Interconnects for RVLSI and WSI: Part II-Restructurable Interconnects for RVLSI and WSI, Proceedings of the IEEE, vol. 72, No. 12, p. 1687, Dec. 1984.

MOSFET Look-Ahead Bit Incrementor/Decrementor, IBM Technical Disclosure Bulletin; vol. 28 No. 2, Jul. 1985.

O. Ishizuka, Synthesis of a Pass Transistor Network Applied to Multi-Valued Logic, The Sixteenth International Symposium on Multiple-valued Logic; May 27-29, p. 51, 1986.

A. El-Gamal, J. Greene, J. Reyneri, E. Rogoyski, K. El-Ayat and A. Mohsen, An Architecture for Electrically Configurable Gate Array; IEEE Custom Integrated Circuits Conference, p. 15.4.1, 1988.

J. Rose, The Effect of Logic Block Complexity on Area of Programmable Gate Arrays; IEEE 1989 Custom Integrated Circuits Conference, p. 5.3.1.

K. El-Ayat, A. El Gamal, R. Guo, J. Chang, R. Mak, F. Chiu, E. Hamdy, J. McCollum, A. Mohsen, A CMOS Electrically Configurable Gate Array; IEEE Journal of Solid-State Circuits, vol. 24, No. 3, p. 752, Jun. 1989.

A. El Gamal, J. Greene, J. Reyneri, E. Rogoyski, K. El-Ayat and A. Mohsen, An Architecture for Electrically Configurable Gate Arrays; IEEE Journal of Solid-State Circuits, vol. 24, No. 2, p. 394, Apr. 1989.

Types SN54173, SN54LS173, SN74LS173 4-Bit D-Type Registers with 3-State Outputs, Texas Instruments Databook, date of publication unknown.

(List continued on next page.)

OTHER PUBLICATIONS

Types SN54180, SN74180 9-Bit Odd/Even Parity Gernerators/Checkers, Texas Instruments Databook, date of publicaton unknown.

Monolithic Memories, Inc., Bipolar LSI Data Book, First Edition; Four-Bit Bipolar Microprocessor Slice 2901A, p. 7—7; 1978.

Monolithic Memories, Inc., Bipolar LSI Data Book, First Edition; Four-Bit Bipolar Microprocessor Slice 6701, pp. 7-75; 1978.

AMI, 1984 MOS Products Guide, Semi-Custom Capabilities, p. 1.20, 1984.

LSI Logic, Databook and Design Manual HCMOS Macrocell Manual; pp. 8-1, 12-10, 12—12, 12-16, 12-19, 12-21, 12-24, 12-25, 12-26, 12-102, Oct. 1986.

Texas Instruments, Inc., SN54HC253, SN74HC253 Dual 4-Line to 1-Line Data Selectors/Multiplexors with 3-State Outputs, Texas Instruments High Speed CMOS Logic Data Book; pp. 2-337, Revised Sep. 1987.

Motorola Inc., MC14051B, MC14052B, MC14053B Analog Multiplexer/Demultiplexers, Motorola CMOS Logic Data; Motorola Inc., pp. 6-129, 1988.

National Semiconductor GAL Data Sheets and Design Guide, Programmable Login Devices Databook and Design Guide; pp. 2-129-2-226, 1990.

F. Matthew Rhodes, Richard Goldenberg, David Allen and Jack I. Raffel; A Chip Design for Rapid Turnaround IC Customization Using Laser Programmed Connections, MIT Lincoln Labs.

Sau C. Wong, Hock C. So, Jung H. Ou and John Costello; A 5000-Gate CMOS EPLD with Multiple Logic and Interconnect Arrays; IEEE 1989 Custom Integrated Circuits Conference, p. 5.8.1.

J. P. Gray and T. A. Kean; Configurable Hardware: A New Paradigm for Computation.

Sven E. Wahlstrom, Edison Fong, Michael S. C. Chung, Jimmy Gan and Jimmy Chen; An 11000-Fuse Electrically Erasable Programmable Logic Device (EEPLD) with an Extended Macrocell; IEEE Journal of Solid-State Circuits vol. 23, No. 4 Aug. 1988.

Se Jun Hong and Daniel L. Ostapko; IEEE 1980, FIT-PLA: A Programmable Logic Array for Function Independent Testing, p. 131.

Hideo Fujiwara, Kozo Kinoshita and Hiroshi Ozaki; International Symposium on Fault-tolerant Computing, IEEE Universal Test Sets for Programmable Logic Arrays, p. 137, 1980.

Introduction to Switching and Automata Theory; Chapter 3 Combinational Switching Circuits.

John Hayes; A Unified Switching Theory with Applications to VLSI Design, Proceedings of the IEEE, vol. 70, No. 10, Oct. 1982.

X. Chen and S. L. Hurst; A Consideration of the Minimum Number of Input Terminals on Universal Logic Gates and Their Realization; Int. J. Electronics, vol. 50, No. 1-13; p. 1, 1981.

Leo Hellerman; A Catalog of Three-Variable Or-Invert and And-Invert Logic Circuits, IEEE Transactions on Electronic Computers.

Tung Symon Chang, Tung Symon Chang, Jenq-Sian Chang, Laurence Cooke, Jin-Sheng Shyr, William W. Walker, Lin C. Wu and John J. Zasio; High Speed Submicron CMOS Gate Arrays for Computer Applications.

The TTL Data book for Design Engineers, Texas Instruments, Bulletin No. DL-S 7711847, Mar. 1974-Revised Aug. 1977, pp. 7-181-7-182.

IEEE Transactions on Computers, "A Comparison of Universal-Logic-Module realizations and Their application in the Synthesis of Combinatiorial and Sequential Logic Networks", Feb. 1982, vol. c-31, No. 2, pp. 140-147.

8057 L'Onde Electrique, "Utilisation de multiplexeurs pour la realisation de fanctions logiques", by Lotfi et al, vol. 59, Nov. 1979, No. 11, pp. 81-86.

Elektronik, "Bistabile Kippstufen aus universalen Logikschaltungen", Sep. 1972, vol. 21, pp. 299-302.

IEEE Transactions on Computers, "Universal Logic Modules and Their Applicaitons", by Yau et al, vol. C-19, No. 2, Feb. 1970, pp. 141-149.

Int. J. Electronics, "Programmable universal logic module", by Murugesan, S., 1976, vol. 40, pp. 509-512.

LOGIC MODULE WITH CONFIGURABLE COMBINATIONAL AND SEQUENTIAL BLOCKS

This application is a continuation of application Ser. No 07/773,353, filed Oct. 7, 1991, now U.S. Pat. No. 5,198,705, which is a continuation of application Ser. No. 07/522,232, filed May 11, 1990, now U.S. Pat. No. 5,055,718.

BACKGROUND OF THE INVENTION

1. FIELD OF THE INVENTION

The present invention relates to digital electronic circuits. More specifically, the present invention relates to circuits for performing logic functions in user-programmable integrated circuits, and to circuits for implementing a wide variety of user-selectable combinatorial and sequential logic functions.

2. THE PRIOR ART

Programmable logic blocks which are capable of performing a selectable one of a plurality of user-selectable logic functions are known in the prior art. U.S. Pat. No. 4,910,417 to E1 Gamal et. al., assigned to the same assignee as the present invention, and U.S. Pat. No. 4,453,096 to Le Can et. al., disclose logic modules composed of multiplexers capable of performing a plurality of combinatorial functions.

While these circuits provide a degree of flexibility to the designer of user-programmable logic arrays, there is always a need for improvement of functionality of such circuits.

BRIEF DESCRIPTION OF THE INVENTION

In a first aspect of the present invention, a logic module is provided having a wide variety of user-configurable combinational and sequential logic functions. In a first stage of a combinatorial section, the logic module includes a first and a second two-input multiplexer each having first and second data inputs. Both the first and second multiplexer include a select input, both of which are connected to the output of a two-input logic gate of a first type having first and second data inputs. The inputs to the first and second two-input multiplexers are sourced with data signals from a first group. One input of each of the logic gates is sourced from a data signal of a second group and the other input of each of the logic gates is sourced from a data signal of a third group.

In a second stage of the combinatorial section of the logic module, a third two-input multiplexer has its first and second data inputs connected the outputs of the first and second multiplexers, respectively. A select input of the third two-input multiplexer is connected to the output of a two-input logic gate of a second type having first and second data inputs.

In a first stage of a sequential section of the logic module of the present invention, the output of the third two-input multiplexer is connected to a first data input of a fourth two-input multiplexer having a HOLD1 input coupled to its select input. Its output and a low active CLEAR input are presented to an AND gate whose output is connected to the second data input of the fourth two-input multiplexer and to the first data input of a fifth two-input multiplexer in a second stage of the sequential section of the logic module of the present invention. The select input of the fifth two-input multiplexer is connected to a HOLD2 input. Its output and the CLEAR input are presented to an AND gate whose output is connected to the second data input of the fifth two-input multiplexer and to an output node. The CLEAR, HOLD1 and HOLD2 inputs are defined by combinations of signals from a data signal of a third group which may contain a data signal of one of the other groups.

BRIEF DESCRIPTION OF THE DRAWINGS

FIG. 2b is a logic diagram in block form of a presently preferred circuit for use in performing the function of the circuit of FIG. 2a.

DETAILED DESCRIPTION OF A PREFERRED EMBODIMENT

Figure 1:
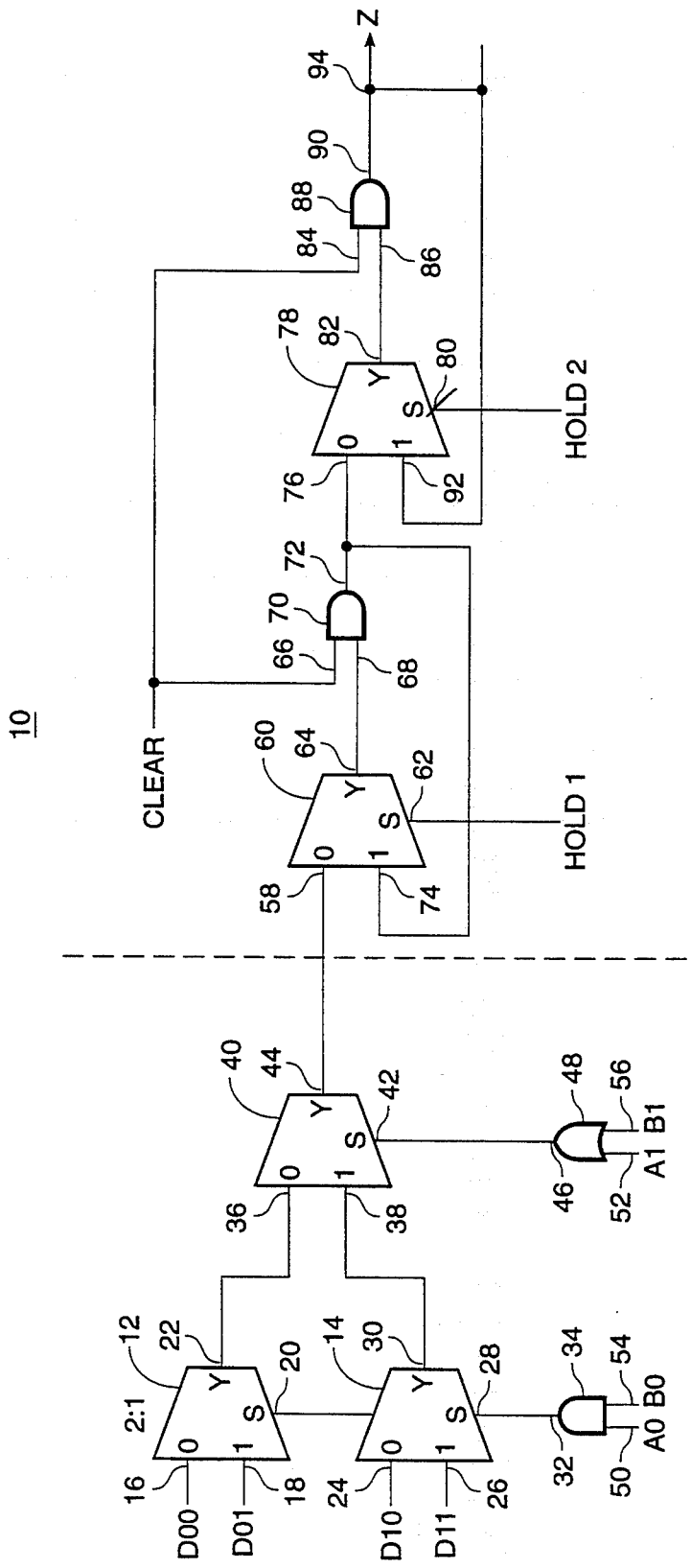
FIG. 1 is a block diagram of a logic module according to a presently preferred embodiment of the present invention.

Referring first to FIG. 1, a block diagram of a presently preferred embodiment of a logic module according to the present invention, a logic module 10 is shown having configurable combinational and sequential blocks. The combinatorial portion of the logic module includes first and second sections. A first section of the logic module 10 of the present invention includes first and second two-input multiplexers 12 and 14. First two-input multiplexer includes first and second data inputs 16 and 18, select input 20 and output 22. Second two-input multiplexer has first and second data inputs 24 and 26, select input 28 and output 30. Select inputs 20 and 28 of first and second two-input multiplexers 12 and 14 are connected to the output 32 of a two-input logic gate of a first type 34 having first and second data inputs 50 and 54.

Outputs 22 and 30 of first and second two-input multiplexers 12 and 14 are connected to data inputs 36 and 38 of third two-input multiplexer 40, in a second section of logic module 10. Third two-input multiplexer 40 also includes select input 42 and output 44. Select input 42 of third two-input multiplexer 40 is connected to output 46 of a two-input logic gate of a second type 48 having first and second data inputs 52 and 56.

The data inputs 16, 18, 24 and 26 to the first and second two-input multiplexers 12 and 14 are sourced with data signals from a first group of data input nodes shown in FIG. 1 as data inputs D00, D01, D10, and D11. One input of each of logic gates 34 and 48 (reference numerals 50 and 52, respectively) is sourced from a data signal of a second group shown in FIG. 1 as data input nodes A0 and A1, respectively, and the other input of each of the logic gates 34 and 38(reference numerals 54 and 56, respectively) is sourced from a data signal of a third group shown in FIG. 1 as data input nodes B0 and B1, respectively.

The logic module 10 of the present invention offers a plurality of combinatorial functions having up to eight inputs. The function implemented by the circuit of FIG. 1 is:

$$Z=(D00!(A0\cdot B0)D01(Ao\cdot B0))!(A1+B1)+(D10!(A0\cdot B0)+D11(A0\cdot B0))(A1+B1)$$

The combinatorial functions which may be implemented include AND, OR, NAND, NOR, and EX-OR. TABLE I shows the implementation of these functions using different inputs of the circuit of FIG. 1.

TABLE I

| FUNCTION | A0 | B0 | A1 | B1 | D00 | D01 | D10 | D11 | C1 | C2 |
|---|---|---|---|---|---|---|---|---|---|---|
| NAND !(A·B) | A | B | 1 | X | X | X | 1 | 0 | 1 | 0 |
| | A | B | X | 1 | X | X | 1 | 0 | 1 | 0 |
| | A | B | 0 | 0 | 1 | 0 | X | X | 1 | 0 |
| | A | B | 0 | 0 | 1 | 0 | 0 | 0 | 1 | 0 |
| | 1 | A | 0 | B | 1 | 1 | 1 | 0 | 1 | 0 |
| | 1 | A | B | 0 | 1 | 1 | 1 | 0 | 1 | 0 |
| | A | 1 | 0 | B | 1 | 1 | 1 | 0 | 1 | 0 |
| | A | 1 | B | 0 | 1 | 1 | 1 | 0 | 1 | 0 |
| NOR !(A+B) | 1 | 1 | A | B | X | 1 | X | 0 | 1 | 0 |
| | 0 | X | A | B | X | X | 0 | X | 1 | 0 |
| | X | 0 | A | B | X | X | 0 | X | 1 | 0 |
| | 1 | A | 0 | B | 1 | 0 | 0 | 0 | 1 | 0 |
| | 1 | A | B | 0 | 1 | 0 | 0 | 0 | 1 | 0 |
| | A | 1 | 0 | B | 1 | 0 | 0 | 0 | 1 | 0 |
| | A | 1 | B | O | 1 | 0 | 0 | 0 | 1 | 0 |
| AND (A·B) | A | B | 0 | 0 | 0 | 1 | X | X | 1 | 0 |
| | A | B | 1 | X | X | X | 0 | 1 | 1 | 0 |
| | A | B | X | 1 | X | X | 0 | 1 | 1 | 0 |
| | A | B | 0 | 0 | 0 | 0 | 1 | 0 | 1 | 0 |
| | 1 | A | B | 0 | 0 | 0 | 0 | 1 | 1 | 0 |
| | 1 | A | 0 | B | 0 | 0 | 0 | 0 | 1 | 0 |
| | A | 1 | B | 0 | 0 | 0 | 0 | 1 | 1 | 0 |
| | A | 1 | 0 | B | 0 | 0 | 0 | 1 | 1 | 0 |
| OR (A+B) | X | X | A | B | 0 | 0 | 1 | 1 | 1 | 0 |
| | 0 | X | A | B | 0 | X | 1 | X | 1 | 0 |
| | X | 0 | A | B | 0 | X | 1 | X | 1 | 0 |
| | 1 | A | 0 | B | 0 | 1 | 1 | 1 | 1 | 0 |
| | 1 | A | B | 0 | 0 | 1 | 1 | 1 | 1 | 0 |
| | A | 1 | 0 | B | 0 | 1 | 1 | 1 | 1 | 0 |
| | A | 1 | B | 0 | 0 | 1 | 1 | 1 | 1 | 0 |
| XOR (A·!B)+(!A·B) | A | 1 | B | 0 | 0 | 1 | 1 | 0 | 1 | 0 |
| | A | 1 | 0 | B | 0 | 1 | 1 | 0 | 1 | 0 |
| | 1 | A | B | 0 | 0 | 1 | 1 | 0 | 1 | 0 |
| | 1 | A | 0 | B | 0 | 1 | 1 | 0 | 1 | 0 |
| XNOR (A·B)+(!A·!B) | A | 1 | B | 0 | 1 | 0 | 0 | 1 | 1 | 0 |
| | A | 1 | 0 | B | 1 | 0 | 0 | 1 | 1 | 0 |
| | 1 | A | B | O | 1 | 0 | 0 | 1 | 1 | 0 |
| | 1 | A | 0 | B | 1 | 0 | 0 | 1 | 1 | 0 |

Those of ordinary skill in the-art will further appreciate that different gates, such as NAND, NOR, EX-OR gates, could be used as well with slightly different results. In particular, using all like gates on the select inputs (for example, all NAND or NOR gates), increases the number of inputs on the functions (AND OR), while using a mix of gates on the select inputs (for example NAND on the first select input and NOR on the second select input as shown in FIG. 1) increases the number of functions which the module can generate.

Referring again to FIG. 1, it may be seen that the sequential portion of logic module 10 also has two stages. In the first sequential stage, the output 44 of the third two-input multiplexer 40 is connected to a first data input 58 of a fourth two-input multiplexer 60 having its select input 62 driven by a HOLD1 signal from a HOLD1 control node. Its output 64 and a CLEAR signal from a CLEAR control node are presented to inputs 66 and 68 of an AND gate 70 whose output 72 is connected to the second data input 74 of the fourth two-input multiplexer 60 and to the first data input 76 of a fifth two-input multiplexer 78, which forms the input to the second sequential stage. The select input 80 of the fifth two-input multiplexer 78 is connected to a HOLD2 signal from a HOLD2 control node. Output 82 of fifth two-input multiplexer 78 and the CLEAR signal are presented to inputs 84 and 86 of an AND gate 88 whose output 90 is connected to the second data input 92 of the fifth two-input multiplexer 78 and to an output node 94.

In a presently preferred embodiment, the CLEAR, HOLD1 and HOLD2 signals are derived by combinatorial logic from a set of data input signals. As is shown in FIG. 2a, data signals from data input nodes C1, C2 and B0 are presented to inputs 96, 98, and 100, respectively of logic combining circuit 102, which has control node outputs upon which the HOLD1, HOLD2, and CLEAR signals appear, respectively.

Figure 2A:
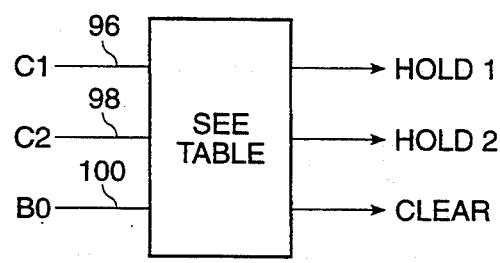
FIG. 2a is a diagram showing a combinatorial circuit for generating the CLEAR, HOLD1, and HOLD2 signals for the circuit of FIG. 1 from data inputs.

The logic combining circuit 102 of FIG. 2a may be any logic circuit for combining the three inputs in a manner which produces outputs for the HOLD1, HOLD2, and CLEAR signals as set forth in the truth table in TABLE II.

TABLE II

| C1 | C2 | HOLD1 | HOLD2 | CLRB |
|---|---|---|---|---|
| 0 | 0 | 0 | 1 | B0 |
| 0 | 1 | 1 | 0 | B0 |
| 1 | 0 | 0 | 0 | 1 |
| 1 | 1 | 0 | 1 | B0 |

Figure 2B:
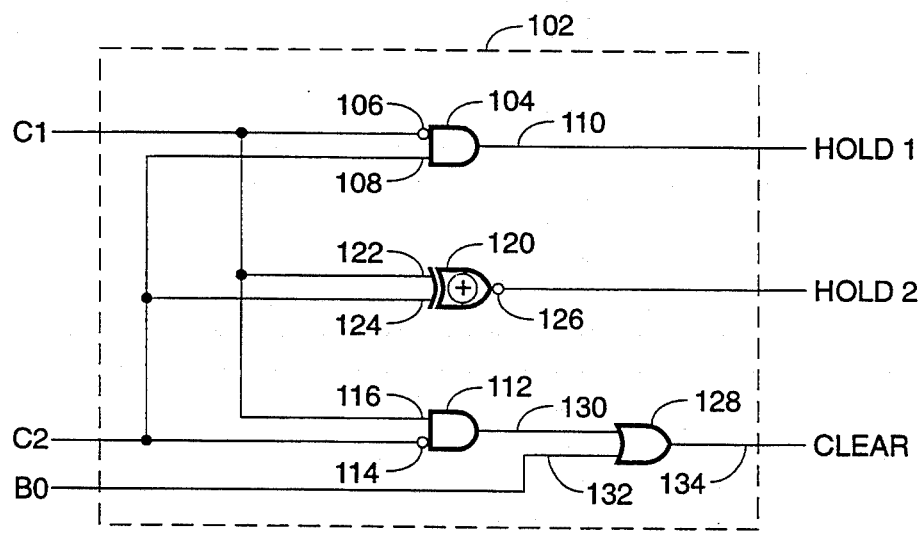

FIG. 2b is a logic diagram of a presently preferred embodiment of such a circuit. Referring now to FIG. 2b, logic combining circuit 102 includes AND gate 104 with inverting input 106 and non-inverting input 108, and output 110, AND gate 112 with inverting input 114 and noninverting input 116 and output 118, EXNOR gate 120 with inputs 122 and 124 and output 126 and OR gate 128 with inputs 130 and 132 and output 134. C1 input 96 is connected to inverting input 106 and noninverting input 116 of AND gates 104 and 112, respectively and to input 122 of EXNOR gate 120. C2 input 98 is connected to noninverting input 108 and inverting input 114 of AND gates 104 and 112, respectively, and to input 124 of EXNOR gate 120. B0 input 100 is connected to input 132 of OR gate 128. The output 130 of AND gate 112 is connected to input 130 of OR gate 128. The output 110 of AND gate 104 is the HOLD1 signal, the output 126 of EXNOR gate 120 is the HOLD2 signal, and the output 134 of OR gate 128 is the clear signal.

The sequential portion of the logic module of the present invention disclosed herein is configurable as a rising or falling edge flip flop with asynchronous low active clear, a transparent low or high latch with asynchronous low active clear, or as a transparent flow-through element which allows only the combinatorial section of the module to be used. All latches and flip flops are non-inverting.

TABLE III illustrates the sequential functions available from the logic module of the present invention. From TABLE III, it can be seen that the sequential functions which may be performed include a negative triggered latch with low active clear, a positive triggered latch with low active clear, a negative triggered flip flop with low active clear, a positive triggered flip flop with low active clear and a flow through mode. As can be seen from TABLE III, the states of inputs A0, D00 and D10 are restricted for positive and negative triggered latches. A0 must equal 1 and both D00 and D10 must equal 0 in order for the output to be low when the latch is in transparent mode and the clear input is active.

TABLE III

| C1  | C2  | FUNCTION             | !CLEAR | RESTRICTIONS      |
|-----|-----|----------------------|--------|-------------------|
| 0   | CLK | Rising Edge Flip Flop | B0    | None              |
| CLK | 1   | Falling Edge Flip Flop | B0  | None              |
| 1   | CLK | High Latch with Clear | B0    | A0=1; D00,D10=0   |
| CLK | 0   | Low Latch with Clear  | B0    | A0=1; D00,D10=0   |
| 1   | CLK | High Latch            | —      | B0=1              |
| CLK | 0   | Low latch             | —      | B0=1              |
| 1   | 0   | Transparent           | —      | None              |

The two-input multiplexers and other logic components of the logic module of the present invention may be fabricated using conventional MOS and CMOS technology.

Figure 3:
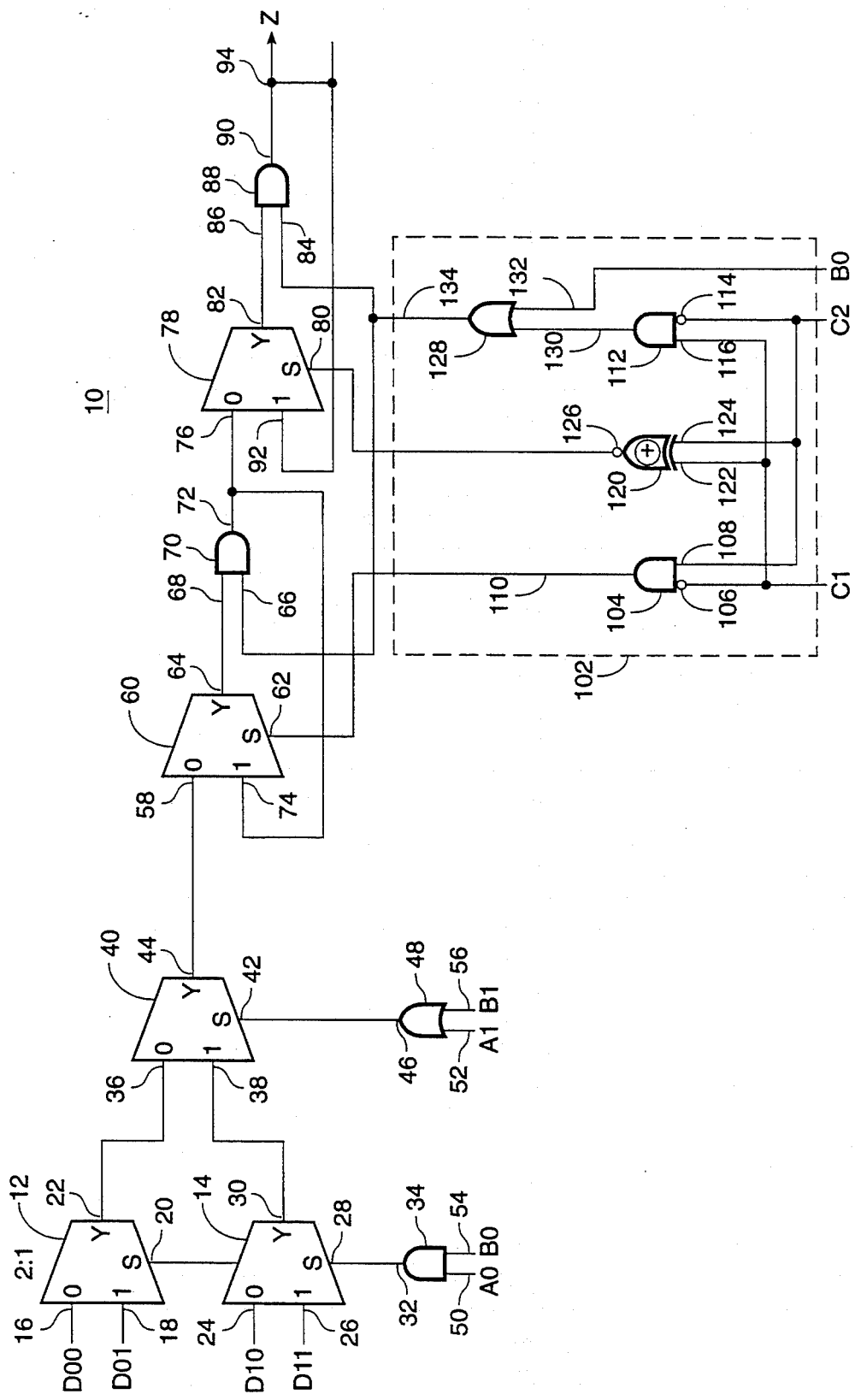
FIG. 3 is a diagram showing a logic module according to a presently preferred embodiment of the invention wherein the portions of the logic module shown in FIGS. 1 and 2b have been combined.

Referring now to FIG. 3, the circuits of FIGS. 1 and 2b are shown combined into a single schematic diagram of a logic module according to a preferred embodiment of the present invention. Using the disclosure and the Tables included herein, it may be seen that, for example, module 10 may be configured to include a rising edge flip flop as the sequential element by placing a logic zero at input C1, using input C2 as a clock, and using input B0 as a low-active clear input. Similarly, the sequential portion of module 10 may be configured as a high-logic or low-logic triggered latch as described in Table III. These examples are, of course, merely illustrative, and those of ordinary skill in the art will recognize from the description herein that numerous other sequential circuit configurations may be realized.

Figure 4:
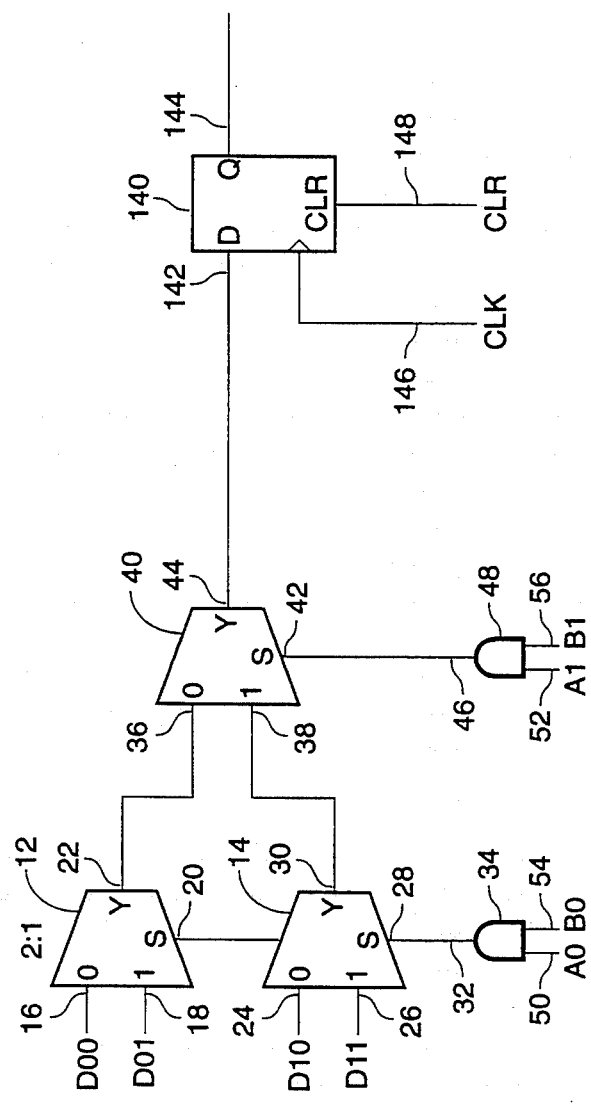
FIG. 4 is an equivalent simplified diagram of a first illustrative embodiment of the circuit of FIG. 3 wherein the sequential portion of the logic module has been configured as a flip-flop.

For the illustrative flip-flop example given above, it will be apparent to those of ordinary skill in the art that the circuit of FIG. 3 may be redrawn as shown in FIG. 4, with the sequential portion of module 10 shown schematically as equivalent flip-flop 140. Flip-flop 140 includes a data input 142 connected to output 44 of third multiplexer 40. Flip-flop 140 also includes Q output 144, clock (CLK) input 146, and low-active clear (! CLR) input 148. It may be also seen that both the gates 34 and 48 of the combinational portion of the module 10 have been represented as AND gates, instead of as one AND gate 34 and one OR gate 48 as shown in FIGS. 1 and 3. As previously stated herein, those of ordinary skill in the art will recognize that the types of gates to use for gates 34 and 48 depends on the particular circuit needs encountered.

As previously mentioned herein and using the disclosure and the Tables included herein, those of ordinary skill in the art will appreciate that, for example, module 10 may be configured to include a high or low logic triggered latch as the sequential element by placing a logic one at input C1, using input C2 as a clock, and using input B0 as a low-active clear input.

Figure 5:
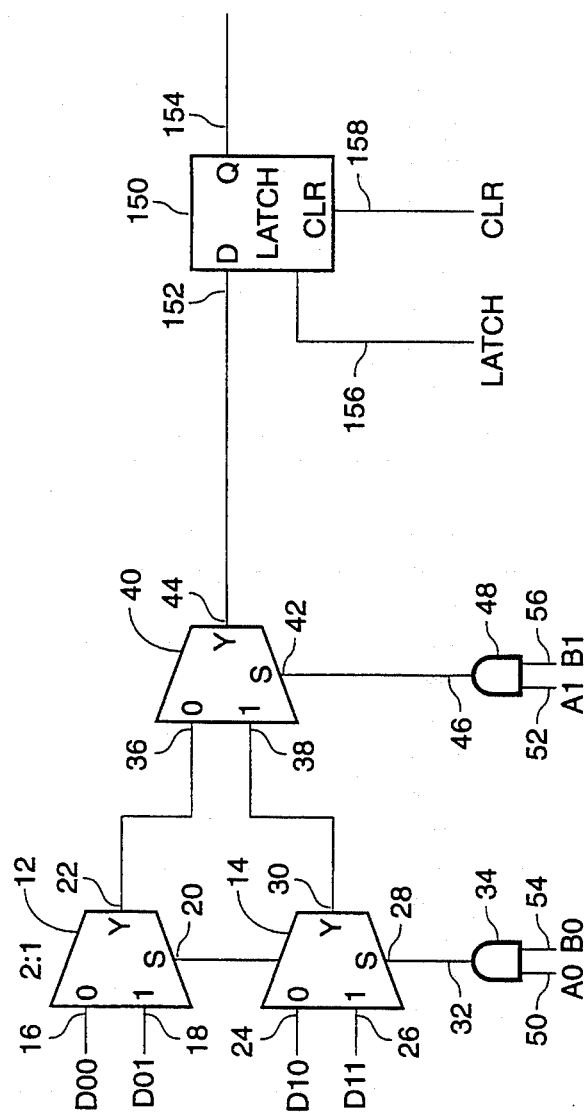
FIG. 5 is an equivalent simplified diagram of a second illustrative embodiment of the circuit of FIG. 3 wherein the sequential portion of the logic module has been configured as a latch.

For the illustrative latch example (three other similar latch examples are given in Table III), it will be apparent to those of ordinary skill in the art that the circuit of FIG. 3 may be redrawn as shown in FIG. 5, with the sequential portion of module 10 shown schematically as equivalent latch 150. Latch 150 includes a data input 152 connected to output 44 of third multiplexer 40. Latch 150 also includes Q output 154, latch input 156, and low-active clear (CLR) input 158.

While presently-preferred embodiments of the present invention have been disclosed herein, those of ordinary skill in the art will be enabled, from the within disclosure, to configure embodiments which although not expressly disclosed herein nevertheless fall within the scope of the present invention. It is therefore, the intent of the inventors that the scope of the present invention be limited only by the appended claims.

What is claimed is:

1. A universal combinatorial logic module comprising:
    a first multiplexer having a first input, a second input, a select input and an output;
    a second multiplexer having a first input, a second input a select input and an output;
    a third multiplexer having a first input connected to said output of said first multiplexer, a second input connected to said output of second multiplexer, a select input and an output;
    a first single logic level gate having a first input and a second input and an output, said output of said first single logic level gate connected to said select input of said first multiplexer; and
    a second single logic level gate having a first input, a second input and an output, said output of said second single level logic gate connected to said select input of said third multiplexer.

2. The logic module of claim 1 wherein said first single logic level gate is an AND gate and said second single logic level gate is an OR gate.

3. A universal combinatorial logic module comprising:
- a first multiplexer having a first input, a second input, a select input and an output;
- a second multiplexer having a first input, a second input a select input and an output;
- a third multiplexer having a first input connected to said output of said first multiplexer, a second input connected to said output of second multiplexer, a select input and an output;
- a first single logic level gate having a first input and a second input and an output, said output of said first single logic level gate connected to said select input of said first multiplexer and said select input of said second multiplexer; and
- a second single logic level gate having a first input, a second input and an output, said output of said second single level logic gate connected to said select input of said third multiplexer.

4. The logic module of claim 3 wherein said first single logic level gate is an AND gate and said second single logic level gate is an OR gate.

5. A universal combinatorial logic module comprising:
- a first multiplexer having a first input, a second input, a select input and an output;
- a second multiplexer having a first input, a second input a select input and an output;
- a third multiplexer having a first input connected to said output of said first multiplexer, a second input connected to said output of second multiplexer, a select input and an output;
- a first single logic level gate having a first input and a second input and an output, said output of said first single logic level gate connected to said select input of said first multiplexer and said select input of said second multiplexer;
- a second single logic level gate having a first input, a second input and an output, said output of said second single logic level gate connected to said select input of said third multiplexer; and
- a sequential element having an input connected said output of said third multiplexer.

6. The logic module of claim 5 wherein said first single logic level gate is an AND gate and said second single logic level gate is an OR gate.

7. A universal combinatorial logic module comprising:
- a first multiplexer having a first input, a second input, a select input and an output;
- a second multiplexer having a first input, a second input a select input and an output;
- a third multiplexer having a first input connected to said output of said first multiplexer, a second input connected to said output of second multiplexer, a select input and an output;
- a first single logic level gate having a first input and a second input and an output, said output of said first single logic level gate connected to said select input of said first multiplexer and said select input of said second multiplexer;
- a second single logic level gate having a first input, a second input and an output, said output of said second single logic level gate connected to said select input of said third multiplexer; and
- a storage element having an input connected said output of said third multiplexer.

8. The logic module of claim 7 wherein said first single logic level gate is an AND gate and said second single logic level gate is an OR gate.

9. A universal combinatorial logic module comprising:
- a first multiplexer having a first input, a second input, a select input and an output;
- a second multiplexer having a first input, a second input a select input and an output;
- a third multiplexer having a first input connected to said output of said first multiplexer, a second input connected to said output of second multiplexer, a select input and an output;
- a first single logic level gate having a first input and a second input and an output, said output of said first single logic level gate connected to said select input of said first multiplexer and said select input of said second multiplexer;
- a second single logic level gate having a first input, a second input and an output, said output of said second single logic level gate connected to said select input of said third multiplexer; and
- a flip-flop having an input connected said output of said third multiplexer.

10. The logic module of claim 9 wherein said first single logic level gate is an AND gate and said second single logic level gate is an OR gate.

11. A universal combinatorial logic module comprising:
- a first multiplexer having a first input, a second input, a select input and an output;
- a second multiplexer having a first input, a second input a select input and an output;
- a third multiplexer having a first input connected to said output of said first multiplexer, a second input connected to said output of second multiplexer, a select input and an output;
- a first AND gate having a first input and a second input and an output, said output of said first AND gate connected to said select input of said first multiplexer and said select input of said second multiplexer;
- an second AND gate having a first input, a second input and an output, said second AND gate connected to said select input of said third multiplexer; and
- a flip-flop having an input connected said output of said third multiplexer.

* * * * *

UNITED STATES PATENT AND TRADEMARK OFFICE
CERTIFICATE OF CORRECTION

PATENT NO. : 5,440,245
DATED : August 8, 1995
INVENTOR(S) : Douglas C. Galbraith, Abbas El Gamal, Jonathan W. Greene It is certified that error appears in the above-indentified patent and that said Letters Patent is hereby corrected as shown below:

Column 1, line 23, replace "El" with --El--.

Column 1, line 51, after "connected" insert --to--.

Column 2, line 41, after "multiplexer" insert --12--.

Column 2, line 43, after "multiplexer" insert -14--.

Column 6, line 37, replace "CLR" with --!CLR--.

Column 6, line 51, after the first occurrence of "input" insert --,--.

Column 7, line 6, after the first occurrence of "input" insert --,--.

Column 7, line 28, after the first occurrence of "input" insert --,--.

Column 7, line 42, after "connected" insert --to--.

Column 7, line 52, after the first occurrence of "input" insert --,--.

Column 8, line 8, after "connected" insert --to--.

Column 8, line 32, after "connected" insert --to--.

UNITED STATES PATENT AND TRADEMARK OFFICE
CERTIFICATE OF CORRECTION

PATENT NO. : 5,440,245
DATED : August 8, 1995
INVENTOR(S) : Douglas C. Galbraith, Abbas El Gamal, Jonathan W. Greene It is certified that error appears in the above-indentified patent and that said Letters Patent is hereby corrected as shown below:

Column 8, line 42, after the first occurrence of "input" insert --,--.

Column 8, line 52, replace "an" with --a--.

Column 8, line 56, after "connected" insert --to--.

Signed and Sealed this

Fourth Day of June, 1996

*Attest:*

BRUCE LEHMAN

*Attesting Officer*　　　*Commissioner of Patents and Trademarks*